United States Patent [19]

Sato

[11] 4,242,438

[45] Dec. 30, 1980

[54] PHOTOMASK MATERIAL

[75] Inventor: Masamichi Sato, Asaka, Japan

[73] Assignee: Fuji Photo Film Co., Ltd., Minami-ashigara, Japan

[21] Appl. No.: 611,115

[22] Filed: Sep. 8, 1975

[30] Foreign Application Priority Data

Sep. 6, 1974 [JP] Japan .................................. 49/102795

[51] Int. Cl.$^2$ .............................................. G03C 1/74
[52] U.S. Cl. .................................... 430/278; 430/273; 430/276
[58] Field of Search ...................... 96/67, 86 R, 87 R; 430/273, 276, 278

[56] References Cited

U.S. PATENT DOCUMENTS

| | | | |
|---|---|---|---|
| 3,280,734 | 10/1966 | Fromson | 96/86 R |
| 3,615,553 | 10/1971 | Wainer | 96/86 R |
| 3,702,581 | 11/1972 | Speakman | 96/86 R |
| 3,776,734 | 12/1973 | Kumasaka | 96/86 R |
| 3,808,900 | 4/1974 | Magnota et al. | 96/86 R |
| 3,811,894 | 5/1974 | Yonezawa et al. | 96/86 R |
| 3,874,878 | 4/1975 | Rasch | 96/87 A |
| 3,874,879 | 4/1975 | Rasch | 96/87 A |
| 3,914,126 | 10/1975 | Pinsler | 96/86 R |
| 3,961,962 | 6/1976 | Sato | 204/38 A |

*Primary Examiner*—Jack P. Brammer
*Attorney, Agent, or Firm*—Sughrue, Rothwell, Mion, Zinn and Macpeak

[57] ABSTRACT

A photomask material which comprises a transparent support having a transparent electroconductive layer thereon, the transparent electroconductive layer having thereon a transparent porous aluminum oxide layer formed by anodic oxidation, the aluminum oxide layer containing over the entire layer a uniform distribution of a number of fine pores having a light-sensitive silver halide therein.

16 Claims, No Drawings

PHOTOMASK MATERIAL

BACKGROUND OF THE INVENTION

1. Field of the Invention

The present invention relates to a novel photomask material.

2. Description of the Prior Art

Photomasks having high resolving power are necessary in the production of, for example, so-called integrated circuits (IC). As the photomask material for producing photomasks, a photographic material comprises a transparent support having coated thereon a silver halide photographic emulsion, in which material silver images are formed to prepare a photomask (hereinafter referred to as an emulsion mask), has been used. A large amount of this type of material is still being widely used.

However, an emulsion mask has many disadvantages in that the image layer is mechanically weak, the silver image is opaque to visible light as well, and the edge acuity is poor due to the grain property of silver.

Therefore, an excellent photomask without these disadvantages has been desired in this field. The so-called hard mask, represented by a chromium mask, has been developed to satisfy these requirements. At present, a chromium oxide mask, an iron oxide mask, a silicon mask, etc., are also known as well as the above-described chromium mask. These masks, except for the chromium mask, provide semi-transparent mask images (with these masks usually being called "see-through" masks) and these hard masks are extremely strong and durable. However, in comparison with the above-described emulsion mask, these masks possess the following defects. That is, since the hard mask material itself is not light-sensitive, a photoresist must be coated thereon to utilize a light sensitivity of the phtoresist, in order to prepare a hard mask having a hard mask material. However, the sensitivity of the photoresist is usually on the order of an ASA of about $10^{-5}$, which is far smaller than the sensitivity of an emulsion mask having a sensitivity on the order of an ASA of $10^{-2}$. This poor sensitivity requires a prolonged exposure time to expose this photomask material using a photo-repeater. Furthermore, a hard mask has the defect that the surface reflection of the mask is so high that light reflected on the surface upon imagewise exposure diffuses within the photoresist layer to reduce the resolving power. Another defect with a hard mask is that since the mask layer at the image area projects on the support, the mask layer is often chipped when the mask is pressed against a semiconductor wafer, with the mask image being worn away. This phenomenon naturally leads to a reduction in the life of the hard mask.

Therefore, the development of a photomask which possesses both the advantages of an emulsion mask (i.e., a high sensitivity and low surface reflection) and the advantages of a hard mask (i.e., high durability, see-through ability and good edge acuity) has been strongly desired.

Investigations have been made to apply the art relating photographic materials such as "Metalphoto", "Alphoto" or like trade named materials, to photomask use. Such a photographic material is prepared by subjecting the surface of an aluminum plate to anodic oxidation to form an aluminum oxide layer of a thickness of several microns to several tens of microns and filling the fine pores of about several hundred angstroms in size formed in the oxide layer with silver halide (hereinafter referred to for brevity as "aluminum photomaterial").

With this photographic material, the silver image can be formed by subjecting the material to development and fixing processing after imagewise exposure, in a manner similar to ordinary silver halide photographic materials.

As is well known, a photomask must have the property that the non-image areas are transparent to the light to which the photoresist is sensitive. However, since the above-described aluminum photomaterial has an opaque support of an aluminum plate, the material cannot be utilized as a photomask. Therefore, attempts were made to use a material comprising a transparent support having thereon an aluminum thin film layer, in place of the aluminum plate and to subject the thin film layer to anodic oxidation to thereby render the thin film layer transparent, as described in Japanese Patent Application No. 13478/73, corresponding to U.S. patent application Ser. No. 528,317 filed Nov. 29, 1974 now U.S. Pat. No. 3,961,962. The term "transparent" as used herein in the present invention means "transparent in visible and near ultraviolet light regions".

According to the method of the above-described application, an aluminum thin layer is provided on a transparent support by means of, for example, vacuum evaporation or sputtering, the aluminum thin layer is then anodically oxidized by contacting it with an electrolytic solution (under conditions such that the anodic oxidation rate of the aluminum thin layer is continuously reduced in the direction of from one portion of the layer to the other portion of the layer) to thereby render the thin layer transparent, and a light-sensitive silver halide is incorporated in a number of the resulting fine pores formed in the aluminum oxide thin film and uniformly distributed over the entire oxide film.

The photomask material obtained by this above described method provides good adhesion between the support and the oxide film, scarcely results in islands of aluminum remaining on the interface of the support and the oxide film, and further provides the following advantages in comparison with an aluminum photomaterial.

(1) With an aluminum photomaterial, an oxide film of a thickness of about $10\mu$ is usually necessary for obtaining silver images with sufficient optical density, whereas in the above method a sufficient density is obtained with an oxide film having a thickness of about $2\mu$. A thin oxide film is advantageous for a photomask having high resolving power since any reduction in resolving power due to light-scattering in the oxide film is small.

(2) With a conventional aluminum photomaterial, silver halide is incorporated in the fine pores of the oxide film in an amount of about 5 volume % at the highest. The reason for this is if silver halide is incorporated in greater amount, an unexplainable reduction in the silver image density occurs. However, in the above-described method, the advantageous phenomenon that the silver image density increases as the amount of the silver halide incorporated in the fine pores increases has been discovered. That is, in the production of a conventional aluminum photomaterial, the following unexplainable phenomenon occurs: when, silver nitrate is first incorporated and then potassium bromide is fed into the fine pores to deposit silver halide grains therein and, after drying, this processing is repeated to further fill the pores with silver halide, the optical density of the silver images becomes lower than if the process of incorporating the silver halide is conducted only one time. If the process for incorporating the silver halide is conducted three times, the optical density of the silver images is further reduced. In contrast, in the above described method, the optical density of the silver images increases as the number of times that the process for incorporating the silver halide is conducted increases. This fact is completely opposite to the phenomenon which occurs with the conventional aluminum photomaterial. This is extremely effective for the purpose of obtaining silver images with a high optical density from a thin oxide film.

(3) With a conventional aluminum photomaterial, the shelf life of the photographic material is shorter than that of a normal silver halide photographic material having a silver halide emulsion layer as a light-sensitive layer, probably because of the presence of an aluminum layer under the aluminum oxide layer. Aluminum is quite active to silver halide and reduces silver halide to silver upon contact. However, in the above described method, an aluminum layer is scarecely present under the aluminum oxide layer, and hence the shelf life of the photographic material as described in Japanese Patent Application 13478/73, corresponding to U.S. patent application Ser. No. 528,317 filed Nov. 29, 1974 is extended.

As can be understood from the above descriptions, marked differences are present between the technique of the above-described method and a conventional aluminum photomaterial. However, it has been found that the photomask material obtained by the above-described method has the following disadvantages. That is, if the surface of the aluminum thin film provided on the transparent support is a mirror surface, a good photomask material is obtained; however, if the surface of the aluminum layer is not a mirror surface, in other words, is cloudy or tarnished, fine aluminum grains remain uniformly on the interface of the transparent support and the anodic oxide film. It has been found that the remaining aluminum grains correspond to the surface granular pattern of the aluminum thin layer. It becomes difficult to maintain the surface of the aluminum thin layer as a mirror surface, as the thickness of the aluminum thin layer increases. Empirically, a thickness of more than $2\mu$ tends to result in a cloudy surface.

It is not preferred that a small amount of aluminum remains uniformly in a fine granular state on the interface of the transparent support and the oxide layer, since the transparency of the photomask is lowered.

It has been found that, in the above-described method, when the thickness of the aluminum thin layer is relatively small (e.g., less than about $2\mu$) and is a mirror surface, no aluminum remains in the form of small islands on the interface of the support and the oxide layer, but an aluminum film of thin uniform layer having a thickness of about 5 mm remains. Therefore, the transmittance of the oxide layer is reduced by a factor of about 10 to 20%, and further, there is the possibility that the silver halide in the fine pores is reduced during long storage.

SUMMARY OF THE INVENTION

Therefore, an object of the present invention is to provide a photomask material having a high sensitivity which can provide high image density, high transmittance at non-image area in the visible and ultraviolet light regions, high resolving power, good edge acuity and low surface reflection.

Another object of the present invention is to provide a photomask material which can provide a mechanically strong and durable mask image present in one of the layers intimately adhered to the support.

A further object of the present invention is to provide a photomask material in which the processes after imagewise exposure to form a mask image are simple.

Accordingly, this invention provides a photomask material which comprises a transparent support having a transparent electroconductive layer thereon, the transparent electroconductive layer having thereon a transparent porous aluminum oxide containing, over the entire layer, a uniform distribution of a number of fine pores having a light-sensitive silver halide therein.

DETAILED DESCRIPTION OF THE INVENTION

Each element of the present invention is explained in greater detail below.

The term "transparent support" designates a support which is capable of transmitting not less than about 50%, preferably not less than 70%, of electromagnetic waves in the near ultraviolet (e.g., about 2900 Å) range and visible light (e.g., about 4000 Å to 7000 Å) range.

Suitable examples of transparent supports which can be used in the present invention include a transparent plate or film of glass (e.g., a silica glass, a soda-lime glass, a potash glass, a lead alkali glass, a barium glass, a borosilicate glass, etc.), a transparent plate or film of natural or synthetic minerals (e.g., sapphire, ruby, quartz, beryl, etc.), a transparent synthetic resin plate or film (e.g., polymethyl methacrylate, polyethylene terephthalate, polycarbonate, polystyrene, polyethylene, polypropylene, etc.), and the like. These supports are generally used in a plate-like form and are sufficient to function as the support of the photomask as long as a thickness suitable for use as a photomask (usually about 0.5 to 3 mm) is employed. The function required for the support is to retain the mask images, without deformation, formed in the mask image layer on the support.

On the transparent support is provided a transparent electroconductive thin film layer. Conventionally known thin film-forming methods such as vacuum deposition or sputtering can be utilized for this purpose. Suitable thin film-forming methods which can be used are described in L. I. Maissel & R. Glang, *Handbook of Thin Film Technology*, Chapter 1, McGraw-Hill, New York (1970). The thickness of the thin layer formed is preferably about 0.005 to about $0.6\mu$. If a thickness less than about $0.005\mu$ is employed, the electroconductivity of the thin film is so low that the thin film can not be used as an electrode for the anodic oxidation, whereas if the thickness is greater than about $0.6\mu$, not only is such economically disadvantageous but also the transparency of the thin film is reduced. In short, a necessary and sufficient thickness is employed, and a more preferred thickness ranges from about 0.01 to about $0.3\mu$. The above-described descriptions, on the other hand, mean that the minimum value of the thickness of the transparent electro-conductive layer is limited by the maximum value of the surface resistivity of the transparent electroconductive layer. That is, the transparent electroconductive layer can be an electrode for anodic oxidation when the surface resistivity thereof is less than about $10^6$ ohm square ($\Omega\square$), and more preferably, less than $10^2$ ohm square.

Suitable examples of a substances which can be used to form the transparent electroconductive layer include gold, platinum, palladium, tin (IV) oxide, indium (III) oxide, etc.

The necessary requirements for the substance which can form the transparent electroconductive layer of the present invention are that no chemical reaction should occur with the transparent electroconductive layer during anodic oxidation and the transparent electroconductive layer should have a surface resistivity within the range as described above. The other requirements for the transparent electroconductive layer will be clear to one skilled in the art from the construction and objects of the present invention.

On the transparent electroconductive layer is provided an aluminum thin film layer. Conventionally known metal film-forming methods such as vacuum deposition, sputtering, ion plating and laminating of a foil can be utilized for this purpose. Suitable film-forming methods which can be used are described in Maissel & Glang, supra. The thickness of the aluminum thin film layer formed is preferably about 1 to $20\mu$. If a thickness less than about $1\mu$ is employed, the silver image density as a photomask image is so low that a practically usable photomask cannot be produced, whereas if the thickness is greater than about $20\mu$, not only is such economically disadvantageous but also the resolving power of the silver images formed later is reduced. In brief, a necessary and sufficient thickness is employed and a more preferred thickness ranges from about 2 to about $10\mu$.

After forming an aluminum film on the transparent electroconductive layer in the above-described manner, this aluminum film is subjected to a conventional anodic oxidation to obtain an aluminum oxide thin film layer.

As the electrolytic solution to be used for the anodic oxidation of aluminum, an oxalic acid aqueous solution at a concentration of about 1 to 20% by weight, a sulfuric acid aqueous solution at a concentration of about 2 to 25% by weight, a chromic acid aqueous solution at a concentration of about 1 to 10% by weight and other known solutions can be used. The electrolysis conditions can be appropriately selected and generally are within the following ranges: electric voltage: about 10 to 120 V; electric current density: about 5 to 50 A/ft$^2$ (0.5 to 4.5 A/dm$^2$); temperature: about 1° to 60° C., preferably 40° to 58° C.

It should be noted that when the surface resistance of the electroconductive layer is small (e.g., about 0.1 to about $10^2$ $\Omega\square$), conventional electrolysis conditions are generally employed. However, when the surface resistance of the electroconductive layer is relatively larger (e.g., about $10^2$ to $10^6$ $\Omega\square$), the electrolysis conditions set forth in copending U.S. application Ser. No. 582,317 filed Nov. 29, 1974 now U.S. Pat. No. 3,961,962 entitled *Photomask Material and Method for Producing the Same* are preferably employed, though such is not necessary.

These ranges are illustrated for convenience for procedures generally used and, needless to say, conditions other than the above-described condition can be employed as long as the oxide film is formed.

The aluminum oxide film thus formed generally has a thickness ranging from about $1.5\mu$ to $30\mu$; has a degree of transparency substantially the same as that of the transparent support hereinbefore described, and contains pores ranging in size from about 200 Å to 1000 Å.

In greater detail, the electroconductivity of the electroconductive layer is much smaller than that of the aluminum layer; therefore electric current flows primarily in the aluminum layer as long as the aluminum layer maintains its original conductivity. However, as the electrolysis proceeds, the thickness of the aluminum layer decreases and the surface resistivity of the layer becomes higher. Accordingly, most of the electric current flows through the transparent electroconductive layer. When the stage is reached that discrete aluminum islands are formed, all electric current flows through the transparent electroconductive layer.

If the surface resistivity of the transparent electroconductive layer is small (0.1 to $10^2$ $\Omega\square$), the aluminum islands can be oxidized easily and uniformly, while if the surface resistivity of the layer is large ($10^2$ to $10^6$ $\Omega\square$), the aluminum islands cannot be oxidized easily and uniformly, that is, the oxidation proceeds faster near the anode. As a result, aluminum islands existing far from the anode are oxidized very slowly, providing somewhat lower transparency.

After forming a transparent, porous and thick aluminum oxide film intimately adhered to the transparent electroconductive layer on the support, silver halide grains are provided in the fine pores of the aluminum oxide film, for example, as disclosed in U.S. Pat. No. 3,615,553. This can be effected by bringing the porous aluminum oxide film into contact with a silver nitrate aqueous solution to fill the fine pores in the thin film with silver nitrate, and then bringing the porous aluminum oxide film into contact with an aqueous solution containing a halogen ion such as potassium bromide, potassium chloride, etc., to thereby precipitate silver halide in the fine pores. Also, silver halide can be provided in the fine pores by reversing the order of the above-described procedures.

Silver halides which can be used for the photomask material of the present invention are silver chloride, silver bromide, silver iodide, silver chlorobromide, silver chloroiodide and silver iodobromide.

For example, to render the oxide film light-sensitive the following solutions can be suitably used.

First Solution

A silver nitrate aqueous solution in a concentration of about 10 to 50% by weight is mainly used, to which gelatin (about 0.1 to 1.0 wt%) is preferably added in a small amount as an anti-fogging agent.

Second Solution

An aqueous solution containing a halogen ion such as potassium bromide, potassium chloride, sodium chloride, ammonium chloride, ammonium iodide, etc., or a mixture thereof, in a concentration of about 2 to 20 wt% can be suitably used. If desired, potassium ferricyanide can be added in a small amount.

The aluminum oxide thin film is contacted with the first solution for a short period of time (e.g., about 0.5 to 5 seconds) to fill the fine pores with silver nitrate, and then contacted with the second solution for a short period of time (e.g., about 0.5 to 5 seconds) to precipitate silver halide in the fine pores, followed by washing for a short period of time (e.g., about 5 to 30 seconds) and drying. The above-described procedures can be effected in the reverse order, if desired. That is, the aluminum oxide thin film can be processed with the second solution and then with the first solution. If desired, the above-described procedures can be repeated two or more times. Further, in that case, the same or a different silver halide can be produced in each repetition of the procedures.

A suitable amount of the silver halide contained in the photomask material of the present invention ranges from 0.5 to 20 mg/dm$^2$ in the basis of the silver contained therein, and more preferably, 0.7 to 15 mg/dm$^2$. An amount of silver halide greater than about 20 mg/dm$^2$ is difficult to incorporate, since the amount of the silver halide which can be filled into the fine pores in the aluminum oxide film is limited by the volume of the pores, and further, is economically disadvantageous since the image density of a silver image after development and fixing processing is saturated. Whereas, if an amount of the silver halide less than about 0.5 mg/dm$^2$ is employed, the silver image density after development and fixing processing is so low that a practically usable photomask cannot be obtained.

The thus sensitized oxide film is exposed, developed and fixed in the same manner as conventional silver halide photographic materials to obtain silver images.

Suitable exposure can be to visible light having a wavelength of about 4000 Å to 7000 Å, to ultraviolet light having a wavelength of about 2900 Å to 4000 Å, to X-rays, both soft and hard, and to electron beams having an acceleration voltage of about 5 KV to 100 KV.

Suitable developing agents which can be used in the method of the present invention are dihydroxybenzenes (e.g., hydroquinone, chlorohydroquinone, bromohydroquinone, isopropylhydroquinone, toluhydroquinone, methylhydroquinone, 2,3-dichlorohydroquinone, 2,5-dimethylhydroquinone, etc.), 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.), aminophenols (e.g., o-aminophenol, p-aminophenol, N-methyl-o-aminophenol, N-methyl-p-aminophenol, 2,4-diaminophenol, etc.), pyrogallol, ascorbic acid, 1-aryl-3-aminopyrazolines (e.g., 1-(p-hydroxyphenyl)-3-aminopyrazoline, 1-(p-methylaminophenyl)-3-pyrazoline, 1-(p-aminophenyl)-3-pyrazoline, 1-(p-amino-m-methylphenyl)-3-aminopyrazoline, etc.), and a mixture of two or more thereof.

The developer generally has a pH of not less than about 8, preferably about 8.5 to 12.5.

The developer can contain, if desired, a preservative (e.g., hydroxylamine hydrochloride, hydroxylamine hydrosulfate, ammonium sulfite, potassium sulfite, sodium sulfite, ammonium hydrogen sulfite, potassium hydrogen sulfite, sodium hydrogen sulfite, L-ascorbic acid, sodium L-ascorbate, tetronic acid, potassium tetronate, an adduct of ethanolamine and sulfurous acid, mixtures thereof, etc.), an alkali agent (e.g., sodium hydroxide, potassium hydroxide, sodium carbonate, potassium carbonate, sodium tertiary phosphate, potassium tertiary phosphate, sodium metaborate, potassium metaborate, borax, mixtures thereof, etc.), a buffer (e.g., sodium dihydrogen phosphate, potassium dihydrogen phosphate, sodium hydrogen phosphate, potassium hydrogen phosphate, sodium hydrogen carbonate, potassium hydrogen carbonate, sodium metaborate, potassium metaborate, sodium tetraborate, potassium pentaborate, sodium nitrate, potassium nitrate, sodium sulfate, potassium sulfate, etc.), a pH adjusting agent (e.g., acetic acid, citric acid or a like organic acid, etc.), a development accelerator (e.g., pyridinium compounds represented by those as described in U.S. Pat. Nos. 2,648,604 and 3,671,247, and Japanese Patent Publication 9503/69 and other cationic compounds, cationic dyes represented by phenosafranine; neutral salts represented by thallium nitrate and potassium nitrate; organic amines represented by those as described in U.S. Pat. Nos. 2,533,990, 2,531,832, 2,950,970 and 2,577,127, and Japanese Patent Publication 9504/69, ethanolamine, ethylenediamine, diethanolamine; benzyl alcohol and phenethyl alcohol as described in U.S. Pat. No. 2,515,147; pyridine, ammonia, hydrazine and amines as described in *NIPPON SHASHIN GAKKAI SHI (Journal of The Society of Photographic Science and Technology of Japan)*, Vol. 14, p. 74 (1952); compounds as described in L. F. A. Mason, *Photographic Processing Chemistry*, pp. 40–43, Focal Press, London (1966), etc.), a dissolving aid (e.g., ethylene glycol, hexylene glycol, diethylene glycol, triethylene glycol, methanol, ethanol, acetone, β-hydroxyethylmethyl ether, dimethylformamide, dimethyl sulfoxide, polyethylene glycol, compounds as described in Japanese Patent Publications 33378/72 and 9509/69, etc.), an anti-fogging agent (e.g., potassium bromide, sodium bromide, potassium iodide or a like halide, etc.; benzotriazoles, mercaptotetrazinedenes, benzothiazoles, mercaptotetrazoles, thiazoles, etc.), a chelating agent (e.g., citric acid, lactic acid, EDTA, disodium salt of EDTA, nitrilotriacetic acid, cyclohexane-diaminetetraacetic acid, iminodiacetic acid, diethylenetriaminepentaacetic acid, N-hydroxymethylethylenediaminetriacetic acid, compounds as described in *Belgisches Chemisches Industrie*, Vol. 21, p.325 (1956) and ibid Vol. 23, p.1105 (1958), etc.) a surface active agent (e.g., natural surface active agents such as saponin, etc., nonionic surface active agents such as alkylene oxides, glycerin compounds, glycidols, cationic surface active agents such as higher alkylamines, quaternary ammonium salts, pyridine and other heterocyclic compounds, phosphoniums or sulfoniums, etc., anionic surface active agents containing acidic groups such as a carboxylic group, sulfonic acid group, phosphonic group, sulfuric ester group, phosphoric ester group etc., ampholytic surfactants such as amino acids, aminosulfonic acids, sulfuric esters or phosphoric esters of amino-alcohols, as described in R. Oda et al *KAIMENKASSEIZAI NO GOSEI TO SONO OYO (Synthesis and Application of Surface Active Agents)*, Maki-Shoten (1964); A. M. Schwartz et al *Surface Active Agents*, Interscience Publications Incorporated (1958); and J. P. Sisley et al, *Encyclopedia of Surface Active Agents*, Vol.2, Chemical Publishing Company (1964), etc.), etc.

On the other hand, suitable examples of silver halide-fixing agents include conventional solvents for silver halide which are well known in the art, such as a water-soluble thiosulfate (e.g., potassium thisulfate, sodium thiosulfate, ammonium thiosulfate, etc.), a water-soluble thiocyanate (e.g., potassium thiocyanate, sodium thiocyanate, ammonium thiocyanate, etc.), a water-soluble organic diol containing sulfur (e.g., 3-thia-1,5-pentanediol, 3,6-dithia-1,8-octanediol, 3,6,9-trithia-1,11-undecanediol, 3,6,9,12-tetrathia-1,14-tetradecanediol, etc.), a water-soluble sulfur-containing organic dibasic acid and a water-soluble salt thereof (e.g., dithioglycollic acid, disodium dithioglycolate, ethylenebisthioglycollic acid, disodium ethylene-bisthioglycolate, thioglycollic acid, sodium thioglycolate, ammonium thioglycolate, etc.), imidazolidinethion, a cyanate (e.g., potassium cyanate, sodium cyanate, etc.), compounds as described in *KAGAKU SHASHIN BINRAN (Handbook of Photographic Science)*, Vol. 2, pp.7–8 and pp.144–151, Maruzen, Tokyo (1959), etc., and mixtures thereof.

The fixing agent-containing solution can contain, if desired, a preservative (e.g., sodium sulfite, ammonium sulfite, potassium sulfite, sodium hydrogen sulfite, potassium hydrogen sulfite, ammonium hydrogen sulfite, etc.), a pH-adjusting agent (e.g., an organic acid such as citric acid, tartaric acid, lactic acid, acetic acid, formic acid, etc., sodium hydroxide, etc.), a pH-buffer (e.g., boric acid, sodium metaborate, potassium metaborate, sodium tetraborate, potassium pentaborate, etc.), a chelating agent (e.g., the same chelate compounds as described for the developer), etc.

The image density of thus obtained silver image can be intensified without reducing the resolving power thereof by applying a known toning treatment or intensifying treatment thereto. Of these, a most effective treatment is that the silver image formed in the aluminum oxide layer is contacted with a solution containing an ion of a noble metal having an ionization tendency smaller than the ionization tendency of silver to convert the silver image into a noble metal image and, at the same time, to form a silver compound therein which is reduced to silver again by treating with a developer. It has been found that the image density of the silver image can be almost doubled by the above-described procedures without reducing the resolving power thereof.

Suitable noble metals which can be used in the above-described procedures are gold, platinum, palladium, rhodium, iridium and ruthenium. A salt, a complex, an oxygen acid, a salt of an oxygen acid, a complex acid, a salt of a complex acid of the noble metal (hereinafter, these compounds, for simplicity, will be designated "noble metal compounds"), or a mixture thereof is dissolved in water to obtain a solution containing noble metal ions (hereafter, the solution will be designated a "toning solution"). The solubility of the noble metal compound in the toning solution, which is an aqueous solution, is not critical. That is, since the concentration of the noble metal compound in the toning can range from about 0.01 wt% to a saturated solution, preferably from 0.05 wt% to a saturated solution, a noble metal compound having a low solubility can be used unless it has an extremely low solubility. Even if a saturated toning solution containing an undissolved noble metal compound having a low solubility is used, the undissolved noble metal compound is dissolved and provides noble metal as the replacement of the silver image with the noble metal proceeds. Further, when the solubility of the noble metal is low, an acid, a base, a salt, a compound capable of forming a complex, or a mixture thereof can be used to increase the solubility.

Examples of noble metal compounds which can be used in the present invention are halides, halo-acids and salts thereof, cyanides, cyano-complex acids and salts thereof, thiocyanato-complex acids and salts thereof, oxygen acids and salts thereof, sulfates, nitrates, double salts such as an alum, an ammine complex, an organic ammine complex, an aquocomplex, and the like. Some specific examples are listed in the following, however, the present invention is not to be construed as being limited to only those compounds. In addition, compounds are listed omitting water of crystallization or optical isomers.

Typical halides of the noble metals include auric (III) chloride, gold(I)-gold(III) chloride, platinum (II) chloride, palladium (II) chloride, rhodium (III) chloride, iridium (III) chloride, iridium (IV) chloride, ruthenium (III) chloride, gold (III) bromide, platinum (III) bromide, platinum (IV) bromide, palladium (II) bromide, rhodium (III) bromide, ruthenium (III) bromide, platinum (IV) iodide, iridium (III) iodide, etc. Typical haloacids of the noble metals include chloroauric (III) acid, chloroplatinic (IV) acid, chloropalladic (IV) acid, chloroiridic (IV) acid, bromoauric (III) acid, bromoplatinic (IV) acid, etc.

Typical halo-acid salts of the noble metals include the lithium salt, the sodium salt, the potassium salt, or the ammonium salt of tetrachloroauric (III) acid ($H[AuCl_4]$), the lithium salt, the sodium salt, the potassium salt, or the ammonium salt of hexachloroplatinic (IV) acid ($H_2[PtCl_6]$), the sodium salt, the potassium salt, the ammonium salt, or the cesium salt of tetrachloroplatinic (II) acid ($H_2[PtCl_4]$), the potassium salt or the magnesium salt of hexachloropalladic (IV) acid ($H_2[PdCl_6]$), the sodium salt, the potassium salt, the ammonium salt or the magnesium salt of tetrachloropalladic (II) acid ($H_2[PdCl_4]$), the lithium salt, the sodium salt, the potassium salt, the ammonium salt or the dimethylammonium salt of hexachlororhodic (III) acid ($H_3[RhCl_6]$), the potassium salt of pentachlororhodic (III) acid ($H_2[RhCl_5]$), the lithium salt, the sodium salt, or the potassium salt of hexachloroiridic (III) acid ($H_3[IrCl_6]$), the lithium salt, the sodium salt, the potassium salt, or the ammonium salt of hexachloroiridic (IV) acid ($H_2[IrCl_6]$), the sodium salt, the potassium salt, or the ammonium salt of hexachlororuthenic (III) acid ($H_3[RuCl_6]$), the sodium salt, the potassium salt, or the ammonium salt of hexachlororuthenic (IV) acid ($H_2[RuCl_6]$), the sodium salt, the potassium salt, the ammonium salt, the dimethylammonium salt, or the tetramethylammonium salt of pentachlororuthenic (III) acid ($H_2[RuCl_5]$), the sodium salt, the potassium salt, the rubidium salt, or the ammonium salt of tetrabromoauric (III) acid ($H[AuBr_4]$), the lithium salt, the sodium salt, the potassium salt, or the ammonium salt of hexabromoplatinic (IV) acid ($H_2[PtBr_6]$), the sodium salt, or the potassium salt of tetrabromoplatinic (II) acid ($H_2[PtBr_4]$), the lithium salt, the sodium salt, the potassium salt, the rubidium salt, the cesium salt, or the ammonium salt of hexabromopalladic (IV) acid ($H_2[PdBr_6]$), the sodium salt, or the potassium salt of tetrabromopalladic (II) acid ($H_2[PdBr_4]$), the sodium salt, or the pyridinium salt of hexabromorhodic (III) acid ($H_3[RhBr_6]$), the sodium salt, the potassium salt, or the ammonium salt of pentabromorhodic (III) acid ($H_2[RhBr_5]$), the sodium salt or the potassium salt of hexabromoiridic (III) acid ($H_3[IrBr_6]$), the sodium salt, the potassium salt, or the ammonium salt of hexabromoiridic (IV) acid ($H_2[IrBr_6]$), the sodium salt, the potassium salt, or the ammonium salt of hexabromoruthenic (IV) acid ($H_2[RuBr_6]$), the methylammonium salt or the trimethylammonium salt of pentabromoruthenic (III) acid ($H_2[RuBr_5]$), etc.

Typical cyanides of the noble metals include gold (I) cyanide, gold (III) cyanide, platinum (II) cyanide, palladium (II) cyanide, rhodium (III) cyanide, iridium (III) cyanide, diruthenium pentacyanide, etc.

Typical cyanocomplex acids and salts thereof of the noble metals include dicyanoaurous (II) acid ($H[Au(CN)_2]$), and the potassium salt or the ammonium salt thereof, tetracyanoauric (III) acid ($H[Au(CN)_4]$), and the sodium salt, the potassium salt, the ammonium salt, or the cobalt thereof, tetracyanoplatinic (II) acid ($H_2[Pt(CN)_4]$), and the sodium salt, the potassium salt, the sodium-potassium salt, or the barium salt thereof, tetracyanopalladic (II) acid ($H_2[Pd(CN)_4]$), and the sodium salt or the potassium salt thereof, hexacyanorhodic (III) acid ($H_3[Rh(CN)_6]$), the potassium salt or the sodium salt thereof, and the adduct of one of these and hexamethylenetetramine, hexacyanoiridic (III) acid ($H_3[Ir(CN)_6]$), and the sodium salt, the potassium salt or the barium salt thereof, hexacyanoruthenic (II) acid, and the sodium salt, the potassium salt, or the barium salt thereof, etc.

Typical thiocyanato complex acids and the salts thereof include tetrathiocyanatoauric (III) acid, and the sodium salt, the potassium salt, or the ammonium salt thereof, hexathiocyanatoplatinic (IV) acid, and the sodium salt, the potassium salt, or the ammonium salt thereof, the sodium salt or the potassium salt of tetrathiocyantoplatinic (II) acid, the sodium salt, the potassium salt, the ammonium salt, or the barium salt of tetrathiocyanato-palladic (II) acid, hexathiocyanatorhodic (III) acid and the potassium salt, or the hexaammine cobalt (III) salt thereof, etc.

Typical oxygen acids and salts thereof of the noble metals include auric acid, the potassium salt thereof, palladium (II) sulfate, palladium (II) nitrate, rhodium (III) sulfate, rhodium-potassium alum, the sodium salt or the potassium salt of ruthenic acid, etc.

Typical ammine complex salts of the noble metals include diammine-gold (I) chloride, diammine-gold (I) bromide, tetraammine-gold (III) triperchloride, tetraammine-gold (III) trinitrate, tris(tetraammine-gold (III) perchloratetetrasulfate, hexaamine-platinum (IV) tetrahydroxide, hexaammine-platinum (IV) tetrachloride, hexaamine-platinum (IV) tetranitrate, tetraamineplatinum (II) dichloride, tetraamine-platinum (II) dinitrate, triammine-hydroxylamine-platinum (II) dichloride, tetraammine-palladium (II) dinitrate, tetraaminepalladium (II) dihydroxide, tetrammine-palladium (II) dichloride, tetraamine-palladium (II) sulfate, hexaamine-iridium (III) trinitrate, hexaammine-iridium (III) trichloride, hexaamine-iridium (III) tribromide, hexaammine-iridium (III) triiodide, hexaammine-ruthenium (III) trichloride, hexaammine-ruthenium (III) tribromide, bishexaammine-ruthenium (III) trisulfate, hexaammine-rhodium (III) trinitrate, hexaammine-rhodium (III) trichloride, hexaammine-rhodium (III) tribromide, bishexaammine-rhodium (III) trisulfate, etc.

Typical organic ammine complex salts of the noble metals include tetraethylamine-platinum (II) dichloride [$Pt(C_2H_5NH_2)_4]Cl_2$, tetraethylamine-platinum (II) dinitrate, tetraethylamine-platinum (II) sulfate, trisethylenediamine-iridum (III) trinitrate, trisethylenediamine-platinum (IV) tetrachloride, trisethylenediamine (IV) tetrathiocyanate, trisethylenediamine-rhodium (III) trichloride, trisethylenediamine-rhodium (III) trithiocyanate, trisethylenediamine-rhodium (III) trinitrate, etc.

Typical aquocomplex salts of the noble metals include aquotriammine-platinum (II) dihydroxide, diaquodiammine-platinum (II) sulfate, aquopentaammine-iridium (III) trinitrate, aquopentaammine-iridium (III) trichloride, aquopentaammine-rhodium (III) trinitrate, aquopentaammine-rhodium (III) tribromide, aquopentaammine-ruthenium (III) trinitrate, ethylenediamine-pyridineamine-platinum (II) dichloride, dithiocyanatodiammine-platinum (II), trisodium dithiosulfatoaurate (I), etc.

Of these noble metal compounds, a chloride, a bromide, a chlorocomplex acid, a sodium salt of a chlorocomplex acid, a potassium salt of a chlorocomplex acid, and an ammonium salt of a chlorocomplex acid of gold, platinum, palladium, rhodium, or iridium, a bromocomplex acid, a sodium salt of a bromocomplex acid, a potassium salt of a bromocomplex acid, and an ammonium salt of a bromocomplex acid of gold or platinum are particularly preferred for the treatment of the silver image obtained by development and fixing of the photomask material of the present invention, since these compounds are moderately stable, their solubility in water is sufficiently high, they are easily commercially available, and further, they can be easily synthesized.

In the toning solution, the noble metal of the noble metal compound is dissolved in an aqueous medium forming cations of the noble metal or the noble metal complex ions in which ligands are co-ordinated with the noble metal cations. When the noble metal cations or the noble metal complex ions are contacted with the silver image in the aqueous medium, the image bearing silver acquires positive electric charges and dissolves into the aqueous medium or forms a water-insoluble silver compound, whereas the noble metal deposits on the silver image areas from the aqueous medium forming a noble metal image. That is, the effect of the toning solution containing the noble metal cations is substantially equal to that containing noble metal complex ions. Therefore, a wide selection of noble metals which can be used for the present invention is possible depending on the treating time and temperature.

The toning solution containing the noble metal compound can contain, if desired, a preservative, a pH-adjusting agent, a surface active agent, and the like.

The silver image obtained is immersed in the toning solution for about 10 sec to several minutes, and the noble metal is deposited at the silver image area. At the same time the image bearing silver forms a water-insoluble silver compound at the silver image area. This silver compound can again be reduced to silver using a developer for a silver halide photographic material or a general reducing agent to form an image comprising a mixture of silver and a noble metal. With this treatment, the image density of the silver image can be almost doubled.

The photomask material of the present invention possesses the following excellent properties as compared with conventionally known emulsion masks and hard masks. First, in comparison with the emulsion mask, silver images formed on the photomask possesses a much higher durability (the same as or greater than the durability of the hard mask), and the aluminum oxide film is extremely hard. A pore-sealing process can render the photomask even more durable, which is incomparable with the gelatin film of the emulsion mask. Also, the edge acuity of the photomask is superior to the edge acuity of the emulsion mask. In addition, since the silver grains forming the silver image have a small size, the silver image can be made transparent to visible light, which enables the transparency to be changed or the silver image can be rendered opaque through intensification or toning, e.g., as disclosed in Pierre Glafkides, *Photographic Chemistry,* Vol. 2, Chapter XIII, Fountain Press London (1958).

On the other hand, in comparison with the hard mask, the silver image of the photomask prepared from the photomask material of the present invention is formed inside the aluminum oxide film, and hence there is no possibility for the projecting mask image to be chipped and damaged as in the case of the hard mask. In addition, the surface reflection is very small, which is an extremely excellent photomask property. In addition, a photomask using the photomask material of the present invention can be prepared using only three steps (exposure, development and fixation) and therefore the steps are simple and the number of steps required are small in comparison with the steps for preparing the hard mask which involve a photoresist coating step, an exposing step, a developing step, an etching step and a resist removal step. In addition, taking into consideration that, with the hard mask, a master of the emulsion mask is further necessary, it can be seen that the photomask material of the present invention is much superior. Further, the light sensitivity of the photomask material is superior to the hard mask as has already been described.

Conventionally known pore-sealing processes for the aluminum oxide film can be utilized. For example, a hot water method wherein an aluminum oxide film is treated with hot water, e.g., 96° C., a water vapor method wherein an aluminum oxide film is treated with superheated water vapor at about 120° to 200° C., a cobalt-nickel method wherein an aluminum oxide film is treated with an aqueous solution of nickel acetate-cobalt acetate at 98° to 100° C., a sodium sulfate method wherein an aluminum oxide film is treated with an aqueous solution of sodium sulfate at 98° to 100° C., a method wherein an aluminum oxide film is treated with an aqueous solution of a weakly basic metal salt at room temperature (e.g., about 20°-30° C.), and a method wherein an aluminum oxide film is treated with an aqueous solution of a nitrate, sulfate, fluoride, chloride, acetate, oxalate, tartarate, or citrate of barium, zinc, cadmium, aluminum, lead, nickel, cobalt, or copper at room temperature, can be utilized. These and other methods for pore-sealing of an aluminum oxide film are described in *DENKI KAGAKU BINRAN* (*A Manual of Electrochemistry*), New Edition, Maruzen, Tokyo (1964); S. Kokubo, *ARUMINIUMU NO HYOMEN SHORI* (*A Surface Treatment of Aluminum*), Uchida Rokakuho Shinsha, Tokyo (1968) and W. W. E. Hübner & A. Schilknecht, *The Practical Anodizing of Aluminum*, Macdonald & Evans, London (1960).

The present invention will now be illustrated in greater detail by reference to the following non-limiting examples of preferred embodiments of the present invention. Unless otherwise indicated, all parts, percents, ratios and the like are by weight.

EXAMPLE 1

Palladium was vacuum deposited on a 1.8 mm-thick glass plate in a thickness of 0.03μ. Aluminum (purity: 99.99%) was then vacuum deposited on the palladium layer in a thickness of 4μ. Then, the resulting aluminum layer was subjected to anodic oxidation. An aluminum plate was used as a cathode. The electric voltage for the electrolysis was 45 V, the electric current density for the electrolysis was 2 A/dm$^2$, and the solution temperature was about 50° C. The anodic oxidation was completed in about 10 minutes. The thus obtained oxide film had a thickness of about 5μ. This film was washed with water and dried, and then rendered light-sensitive according to the following method.

The glass plate having thereon the oxide film formed by the foregoing anodic oxidation was contacted with the following first solution for 1.5 sec, followed by removing the excess solution on the surface and drying.

First Solution

| | |
|---|---|
| Silver Nitrate | 400 g |
| Gelatin | 6 g |
| Conc. Nitric Acid | 1 ml |
| Water to make | 1 liter |

Then, the glass plate was contacted with the following second solution for about 1.5 sec and the excess solution on the surface was removed, followed by washing with water and drying.

Second Solution

| | |
|---|---|
| Potassium Bromide | 50 g |
| Potassium Ferricyanide | 30 g |
| Water to make | 1 liter |

The material subjected to the above-described processing to render the material light-sensitive was usable as a photomask material. The material had a structure in which a number of fine pores in the oxide film were filled with silver halide. This material was imagewise exposed and development-processed for 5 seconds in a developer having the following composition.

(1) Developer

| | |
|---|---|
| Sodium Sulfite (anhydrous) | 30.0 g |
| Paraformaldehyde | 7.5 g |
| Potassium Metabisulfite | 2.6 g |
| Boric Acid | 7.5 g |
| Hydroquinone | 22.5 g |
| Potassium Bromide | 1.6 g |
| Water to make | 1 liter |

Then, the material was immediately washed for 5 seconds with water, and fixed for 10 seconds in a fixing solution having the following composition, followed by washing with water and drying.

(2) Fixing Solution

| | |
|---|---|
| Ammonium Thiosulfate (70% aq. soln.) | 200 ml |
| Sodium Sulfite | 15 g |
| Boric Acid | 8 g |
| Glacial Acetic Acid | 16 ml |
| Aluminum Sulfate (18 hydrate) | 10 g |
| Sulfuric Acid (98%) | 2 ml |
| Water to make | 1 liter |

The thus obtained silver image possessed an optical transmission density of 0.6 at a wavelength of 450 mμ and a resolving power of more than 500 lp/mm. This material was then immersed for about 1 minute in a toning solution having the following composition and washed with water.

(3) Toning Solution 0.3% Aqueous Solution of Chloroauric (III) Acid

The optical transmission density of the image increased to about 0.8. Upon immersing the material for 2 minutes in a developer having the above composition, the optical transmission density increased to about 1.6. The material was then placed in boiling distilled water for 15 minutes, followed by drying. Thus, a durable image was obtained.

EXAMPLE 2

The same procedures as described in Example 1 were followed except that a vacuum-deposited gold layer having a thickness of 0.025μ was used instead of the palladium layer. A resolving power of more than 500 lp/mm was attained.

EXAMPLE 3

The same procedures as described in Example 1 were followed except for changing the thickness of the aluminum film to 3μ and repeating the processing for rendering the oxide film light-sensitive twice. The resulting silver image possessed an optical transmission density of about 3.0 and a resolving power of more than 500 lp/mm.

While the invention has been described in detail and with reference to specific embodiments, thereof, it will be apparent to one skilled in the art that various changes and modifications can be made therein without departing from the spirit and scope thereof.

What is claimed is:

1. A photomask material which comprises an transparent support which is a plate or film of glass, natural or synthetic mineral, or synthetic resin, having thereon a transparent electroconductive layer comprised of gold, platinum, palladium, tin (IV) oxide or indium (III) oxide and having a thickness ranging from about 0.005 to 0.06μ and a surface electric resistivity of about $10^6$ ohm square or less, said electroconductive layer having thereon a transparent porous aluminum oxide layer formed by anodic oxidation, said aluminum oxide layer having a thickness of from about 1.5 to 30μ and containing over the entire layer a uniform distribution of fine pores ranging in size from 200 to 1000 Å with a light-sensitive silver halide incorporated therein.

2. The photomask material of claim 1 wherein said transparent support is capable of transmitting not less than 50% of electromagnetic waves in the near ultraviolet and visible light ranges.

3. The photomask material of claim 2 wherein said transparent support is capable of transmitting not less than 70% of electromagnetic waves in the near ultraviolet and visible light ranges.

4. The photomask material of claim 1 wherein said transparent support is a place or film of glass selected from the group consisting of silica glass, soda-lime glass, potach glass, lead alkali glass, barium glass and borosilicate glass.

5. The photomask material of claim 1 wherein said transparent support is a plate or film of a natural or synthetic mineral chosen from the group consisting of sapphire, ruby, quartz or beryl.

6. The photomask material of claim 1 wherein said transparent support is a plate or film of synthetic resin chosen from the group consisting of polymethyl methacrylate, polyethylene terephthalate, polycarbonate, polystyrene, polyethylene and polypropylene.

7. The photomask material of claim 1 wherein the thickness of said support ranges between about 0.5 to 3 mm.

8. The photomask material of claim 1 wherein the aluminum oxide film is treated with a pore-sealing process.

9. The photomask material of claim 1, wherein the thickness of said transparent electroconductive layer ranges from 0.01 to 0.3μ.

10. The photomask material of claim 1, wherein the surface electric resistivity of said transparent electroconductive layer ranges from about 0.1 to $10^2$ ohm·square.

11. The photomask material of claim 1, wherein the thickness of the aluminum layer on said transparent electroconductive layer before anodic oxidation ranges from about 1 to 20μ.

12. The photomask material of claim 11, wherein the thickness of the aluminum layer provided on said transparent electroconductive layer before anodic oxidation ranges from 2 to 10μ.

13. The photomask material of claim 1, wherein said silver halide is silver chloride, silver bromide, silver iodide, silver chlorobromide, silver chloroiodide, silver iodobromide, or silver chloroiodobromide.

14. The photomask material of claim 1, wherein said silver halide is present in the fine pores in said aluminum oxide layer in an amount ranging from about 0.5 to 20 mg/dm² as silver.

15. The photomask material of claim 1, wherein said silver halide is present in the fine pores in said aluminum oxide layer in an amount ranging from about 0.7 to 15 mg/dm² as silver.

16. The photomask material of claim 1, wherein said silver halide is formed in situ in the fine pores in said aluminum oxide layer by two or more repetitions of precipitation.

* * * * *